US006936494B2

(12) United States Patent
Cheung

(10) Patent No.: US 6,936,494 B2
(45) Date of Patent: Aug. 30, 2005

(54) PROCESSES FOR HERMETICALLY PACKAGING WAFER LEVEL MICROSCOPIC STRUCTURES

(75) Inventor: Kin P. Cheung, Hoboken, NJ (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 26 days.

(21) Appl. No.: 10/691,029

(22) Filed: Oct. 22, 2003

(65) Prior Publication Data

US 2004/0126953 A1 Jul. 1, 2004

Related U.S. Application Data

(60) Provisional application No. 60/420,322, filed on Oct. 23, 2002.

(51) Int. Cl.[7] .............................................. H01L 21/00
(52) U.S. Cl. .......................... 438/55; 438/51; 438/125; 438/126
(58) Field of Search ............................. 438/51, 53, 55, 438/125, 126, 50, 106

(56) References Cited

U.S. PATENT DOCUMENTS 6,454,160 B2 * 9/2002 Gueissaz ..................... 228/256
6,470,594 B1 * 10/2002 Boroson et al. .............. 34/335

OTHER PUBLICATIONS

Y.T. Cheng et al.; Vacuum Packaging Technology Using Localized Aluminum/Silicon–to–Glass Bonding; Center for Wireless Integrated Microsystems; University of Michigan; IEEE 0–7803–5998–Apr. 2001; 2001 (pp. 18–21).

C. Yu et al.; Antireflection Coatings for Advanced Semiconductor Device Metallization Using Laser Reflow and Chemical Mechanical Planarization; Appl. Phys. Lett. 59 (16), Oct. 14, 1991 (pp. 1978–1980).

Ruichen Liu, K. P. Cheung, and W. Y.–C. Lai; A Study of Pulsed Laser Planarization of Aluminum for VLSI Metallization; AT&T Bell Laboratories; 1989 VMIC Conference Jun. 12–13/89; 1989 IEEE TH–0259–2/89/0000–0329 (pp. 329–335).

B. Woratschek et al.; Improved Excimer Laser Planarization of AISI with Addition of Ti or Cu; Siemens AG; 1989 VMIC Conference Jun. 12–13/89; 1989 IEEE TH–0259–2/89/0000–0309 (pp. 309–314).

* cited by examiner

*Primary Examiner*—David Nelms
*Assistant Examiner*—Quoc Hoang
(74) *Attorney, Agent, or Firm*—Kenneth Watov; Watov & Kipnes, P.C.

(57) ABSTRACT

A process for hermetically packaging a microscopic structure including a MEMS device is provided. The process for the present invention includes the steps of depositing a capping layer of sacrificial material patterned by lithography over the microscopic structure supported on a substrate, depositing a support layer of a dielectric material patterned by lithography over the capping layer, providing a plurality of vias through the support layer by lithography, removing the capping layer via wet etching to leave the support layer intact in the form of a shell having a cavity occupied by the microscopic structure, depositing a metal layer over the capping layer that is thick enough to provide a barrier against gas permeation, but thin enough to leave the vias open, and selectively applying under high vacuum a laser beam to the metal proximate each via for a sufficient period of time to melt the metal for sealing the via.

19 Claims, 9 Drawing Sheets

PROCESSES FOR HERMETICALLY PACKAGING WAFER LEVEL MICROSCOPIC STRUCTURES

RELATED APPLICATION

This Application claims priority from U.S. Provisional Application No. 60/420,322, filed on Oct. 23, 2002, and entitled "METHOD TO PRODUCE LOCALIZED VACUUM SEAL AT WAFER LEVEL FOR LOW COST HIGH RELIABILITY PACKAGING."

FIELD OF THE INVENTION

The present invention is related generally to processes for packaging a microscopic structure, and more particularly to processes for packaging a microscopic structure to produce a microelectromechanical system (MEMS) device having an interior cavity.

BACKGROUND OF THE INVENTION

Recent applications of silicon integrated circuit processing technology have led to the development and fabrication of extremely miniaturized devices. Such devices include microelectromechanical systems (MEMS) devices, which consist of an integrated microscopic-scale construction combining electrical and mechanical components. The components of such devices are typically formed and assembled on a silicon substrate using integrated circuit fabrication processes. MEMS devices can be used as switches, sensors, actuators, controllers, phase shifters, switchable/tunable filters and other integrated devices.

Due to their extremely small size, components forming part of the MEMS device can be adversely affected by external factors including RF fields, electromagnetic interference, ambient radiation, dust, gas, shock, sound waves, micro-particles, reactive gases, processing residues, moisture, and the like. To enhance performance and operating life of the device, the component can be packaged in an enclosure or encapsulation. The enclosure defines a cavity in which the component of the MEMS device can safely occupy, particularly mechanical components that need to move, such as a microresonator, for example. The enclosure functions to at least isolate the enclosed component from the external factors, to maintain the electrical connection and mounting of the components, and to permit the moving parts of the mechanical components to move freely therein. The enclosure further provides a physical barrier against shocks and rigors normally associated with handling.

The packaging of MEMS devices are typically not hermetically sealed due to high costs, and are seldom used especially among low cost commercially available packaging. In certain applications, the components of MEMS devices are maintained under specific atmospheric conditions (i.e., pressure, vacuum, temperature, gas compositions). A hermetically sealed cavity is required to sustain such conditions. Such hermetically sealed packaging is typically bulky and expensive to fabricate. Common structural bonding techniques are generally inadequate to provide good pressure sealing due to surface variations and imperfections. It is especially difficult to form a high integrity pressure seal if electrical signals must enter or exit the cavity, such as through electrical wires or feedthroughs.

Currently, components of MEMS devices requiring hermetically sealed environments are typically mounted into expensive and relatively large packages formed from multiple components of metal, ceramic or glass material that are welded or soldered together to form a sealed cavity. In one example, a preformed glass or silicate wafer cap is bonded directly onto a substrate carrying the MEMS component. During the packaging process, the glass or silicate wafer cap must be aligned carefully with the substrate to ensure proper bonding. To accommodate variations on the surface of the substrate, the package is thicker than the substrate, thus necessitating costly thinning to reduce the thickness. In addition to requiring precise alignment and thinning, the process typically exposes the MEMS device to high temperature and high voltage conditions that can undesirably damage the MEMS components. A large amount of contaminants is also undesirably generated from the bonding material used in the packaging process, which can also damage the MEMS device.

Another approach is to cap the MEMS devices either individually or in an array and form a seal with an overcoat of material. This batch packaging can lower material cost and eliminates the need for thinning. However, the time required to precisely align the caps can significantly increase the packaging costs. Using this approach, it would take over two hours to precisely align and place the caps for an array of 1-mm dies supported on a 6-inch wafer. Furthermore, the seals formed in the above processes are not generally structurally robust and thus susceptible to leakage and breakage.

Unfortunately, MEMS packaging employing evacuated cavity or pressurized cavities have not been widely adopted in industry because of the high manufacturing costs typically associated with producing MEMS with well-sealed cavities. The packaging costs of MEMS devices can range from 10 to 100 times the fabrication costs. These high packaging costs make it difficult to develop commercially viable packaged MEMS devices. Attempts to implement low cost wafer-level batch processing have typically met with failure due to device design limitations imposed by the lack of an adequate hermetic seal capable of accommodating electrical feedthroughs and wafer level batch processing methods. As a result, MEMS devices equipped with adequate pressure seal cavities are time-consuming and expensive to produce and have not been widely implemented in industry.

Therefore, there is a need for developing a process for packaging a microscopic structure to yield a microelectromechanical system (MEMS) device with an interior cavity in a cost efficient and timely manner. There is a further need to produce MEMS devices containing an evacuated cavity or pressurized cavity without degrading the packaged microscopic structure, or the overall structural integrity and performance of the MEMS device.

SUMMARY OF THE INVENTION

The present invention is directed generally to a process for packaging a microscopic structure to yield a cavity-containing microstructure such as, for example, a microelectromechanical system (MEMS) device, and more specifically for hermetically packaging the microscopic structure. The cavity of the MEMS device may be configured to be open to ambient or pressure sealed as dictated by the needs and application of the corresponding MEMS device. The presence of a high integrity hermetic pressure seal allows the cavity to be maintained in an evacuated state, or occupied by a specific gas composition in a pressurized or unpressurized state, and ensures that the cavity remains free of microparticles and undesirable gases that may adversely affect the performance of the MEMS device. This process can be utilized in connection with a range of microscopic-scale devices including, but not limited to, resonators, inertial sensors, variable capacitors, switches, and the like.

The process for the present invention overcomes many of the limitations typically associated with conventional sealed cavity microscopic structures. In particular, a sealed-cavity microscopic structure is provided that incorporates both a high integrity hermetic pressure seal, and a structure sufficiently robust to withstand the rigors of normal handling and operation. The process for the present invention can be utilized for chip-scale packaging (CSP) and for wafer-level chip-scale packaging (WLCSP) to effectively provide a low cost and highly adaptable approach for batch packaging microscopic structures.

In one aspect of the present invention, there is provided a process for packaging a microscopic structure, said process comprising the steps of:

assembling a microscopic structure substantially enclosed within a cavity defined by a shell having at least one throughhole extending therethrough in communication with the cavity; and applying a molten material to fill the at least one throughhole wherein the molten material subsequently solidifies to yield a hermetic pressure seal.

In another aspect of the present invention, there is provided a process for packaging a microscopic structure, said process comprising the steps of:

forming shell around a microscopic structure, said shell having a cavity in which said microscopic structure resides;

forming at least one throughhole or via in said shell;

depositing a meltable material onto at least an exterior portion of the shell proximate the at least one throughhole; and selectively heating the meltable material proximate the at least one throughhole to a temperature sufficient to locally melt the material for a sufficient time to cause the molten material to at least partially flow into and block the span of the at least one throughhole prior to the material cooling and solidifying to yield a hermetic pressure seal.

BRIEF DESCRIPTION OF THE DRAWINGS

Various embodiments of the invention are described in detail below with reference to the drawings, in which like items are identified by the same reference designation, wherein.

DETAILED DESCRIPTION OF THE INVENTION

Figure 1:
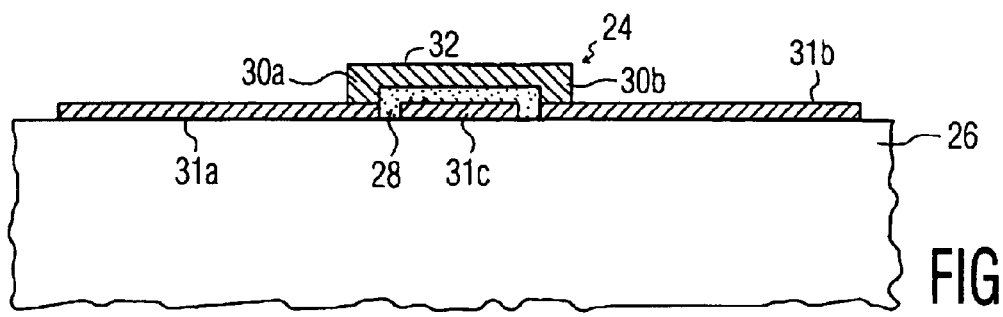
FIG. 1 is a cross sectional view of a microscopic structure forming at least part of a microelectromechanical system (MEMS) device, supported on a substrate in accordance with one embodiment of the present invention.

The present invention is directed generally to a process for packaging a microscopic structure to produce a cavity-containing microstructure such as, for example, a micro-electromechanical system (MEMS) device. The process for the present invention provides a novel wafer level integrated encapsulation method implementing reflow of metal induced by a laser to close and pressure seal vias disposed in a shell defining a cavity occupied in at least a portion thereof by the microscopic structure. The laser reflow step can be carried out under any pressure conditions including vacuum. Applicants have discovered that the process is particularly well suited and reliable for sealing holes or vias with a high aspect ratio (via depth to via opening size) near the upper ends of the holes, to provide a robust hermetic package for the microscopic structure.

The present process can be used to selectively hermetically seal an individual cavity, or a group of cavities with the same or different gas compositions under a range of pressure conditions in a single batch. This feature of the process significantly enhances fabrication and packaging flexibility by allowing one group of cavities to be packaged with one atmospheric condition and another with a different one in a simple and efficient manner. Thus, in one example, this process enables high-Q microresonators, which may be sealed in vacuum to be monolithically integrated with MEMS switches, which may be sealed in dry nitrogen.

The process has been found to be compatible for use with various meltable materials including, but not limited to, aluminum, copper and gold. The process for the invention is especially applicable for use in packaging MEMS components and devices constructed therefrom including switches, sensors, actuators, controllers, phase shifters, switchable/tunable filters and other integrated devices.

In a particular aspect of the present invention, the process for the present invention provides efficient wafer-level packaging through rapid reflow of a metal layer using a laser. The present process effectively produces hermetically sealed microscopic structures at extremely low cost and high output. The present process can be implemented for packaging many submicron scale structures to form cavity containing devices, including resonators, inertial sensors, variable capacitors and switches. The present process is further compatible with additional amelioration measures including, but not limited to, gettering, micro-pumps and micro-temperature control.

The process for the present invention provides key advantages including, but not limited to, Producing wafer level (level zero) encapsulation using surface micromachining technology;

Implementing direct wafer level chip scale packaging (WLCSP);

Forming a seal-in high vacuum, high-pressure, or any controlled atmosphere;

Utilizing room temperature sealing process that minimizes heat-induced stresses during packaging;

Generating high seal integrity that is very tolerant of surface topography;

Enabling easy bake-out for long-term reliability;

Accommodating electrical feed-through and optical feed-through;

Providing RF/microwave compatibility;

Producing very rugged and robust packaging structures; and

Facilitating high throughput, high yield, low area penalty and therefore very low overall cost.

The process for making and constructing MEMS is known to those skilled in the art. Generally, the MEMS fabrication process involves the use of a series of surface micromachining steps. Initially, an insulator usually silicon nitride is deposited on a substrate typically composed of silicon. Thereafter, a sacrificial layer such as an oxide (i.e., silicon dioxide) is deposited on the insulator. The sacrificial layer is typically one to two microns thick. Holes are patterned and etched in the oxide layer which serve as anchor points for anchoring the movable part to the insulator underneath. A polysilicon layer, typically about one to two microns thick, is deposited and patterned on the oxide material for forming the movable part. Finally, the entire substrate or surface is exposed to an etch, which dissolves the oxide material in the sacrificial layer, thus leaving a free standing movable structure anchored to the substrate at the anchor points.

Figure 1A:
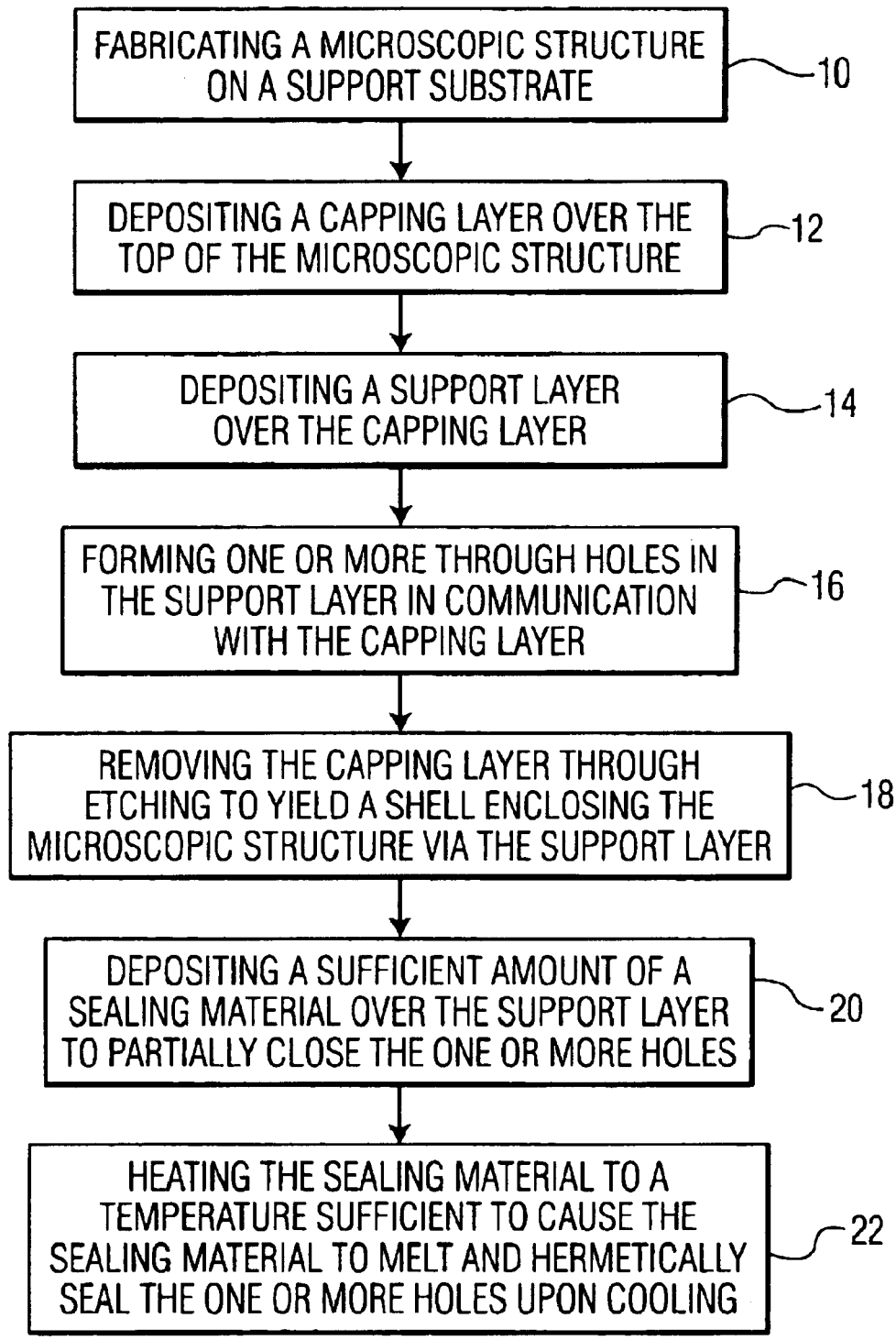
FIG. 1A is a flow chart diagram illustrating the general steps for implementing a process for packaging a microscopic structure which may be in the form of a component of a MEMS device, for example, for one embodiment of the present invention.

Referring now to FIG. 1A, a flowchart 8 illustrating the general steps for implementing the process for the present invention, is shown. The process begins in step 10 by forming or fabricating a microscopic structure, which may represent at least part of a microelectromechanical system (MEMS) device. The microscopic structure can be supported on a flat substrate composed of a suitable material such as silicon. In step 12, a capping layer composed of a sacrificial material, for example, an oxide material is deposited using known deposition techniques including, for example, spin coating, sputtering and chemical vapor deposition. Other sacrificial materials can be selected from photoresistive materials, polyamide, and so forth. The capping layer will provide the structural volume of the cavity. The thickness of the capping layer will depend on the stress control of the microscopic structure, the deposition time, the lateral release etch considerations and the cavity size needs. The capping layer can optionally be patterned through lithographical methods as desired. Once a desired thickness for the capping layer is attained, the process proceeds to step 14 by depositing a support layer onto the exterior surface of the capping layer. The support layer is composed of a suitable material that would maintain a melting point above that of the metal to be deposited thereon, as described below. For example, a nitride material can be used as the support layer if the metal is copper. The deposited support layer defines a shell having a cavity for containing the microscopic structure.

In step 16, through the use of lithographic means one or more throughholes or vias are thereafter etched through the support layer in communication with the capping layer. The number, size and location of the vias are selected to ensure a complete and timely removal of the capping layer to release the underlying microscopic structure, and to facilitate further processing, for example, including outgassing. In step 18, the capping layer is removed through an etch process as known to those skilled in the art. In step 20, a sealing material or meltable material selected from metals including aluminum, gold and copper is sputter deposited over the support layer. The sealing material is deposited in an amount sufficient to provide a good barrier against gas permeation, while maintaining the vias in an open state. In a preferred embodiment, the sealing material is deposited to yield a thickness similar to the diameter of the via. With present technology, vias having a diameter of one micron are typical. In step 22, the sealing material is heated by exposure to a pulse laser to a temperature sufficient to rapidly melt and induce the sealing material to close and seal the vias, thereby yielding a hermetically sealed cavity-containing a MEMS device, in this example. For example, a pulse laser having a pulse duration of from about 10 nanoseconds to 100 nanoseconds is preferred. It may be possible to use a pulse duration as high as 1 microsecond. The laser spot should not be less than the diameter of the vias.

Referring to FIG. 1, a generic microscopic structure 24 is shown in accordance with the present invention. The generic microscopic structure 24 may comprise any suitable electronic component and device constructed therefrom such as a MEMS device. The microscopic structure 24 is fabricated and supported on a substrate 26 and a sacrificial layer 28 using fabrication processes and materials well known to those in the art. In this example, the microscopic structure 24 is a flexural beam microresonator comprising a unitary bridge of electrically conductive material such as doped polysilicon which includes a pair of posts 30a and 30b and a flexural beam 32 extending therebetween. The microscopic structure 24 is supported and mounted at each of the posts 30a and 30b to a corresponding electrode 31a and 31b, respectively. The flexural beam 32 is an electromechanical component, which is intended to move freely within a cavity during operation as will be further described hereinafter. The microscopic structure 24 can further include metal interconnects and connections (not shown), which can extend from the electrodes 31*a* and 31*b* through the substrate 26 to a remote location as known to those skilled in the art.

Figure 2:
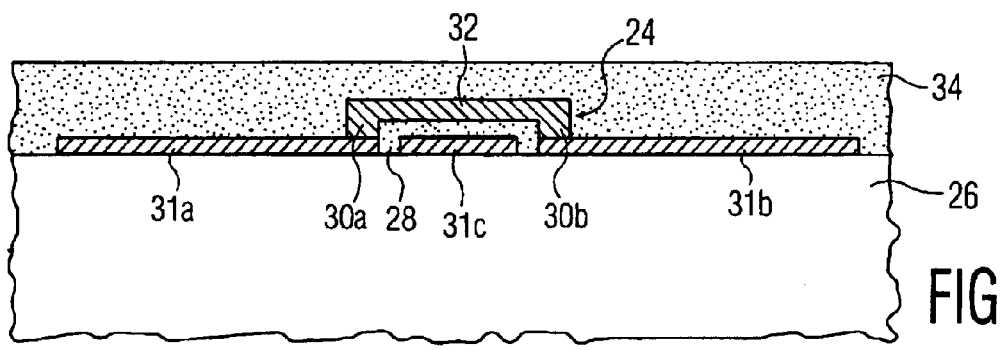
FIG. 2 is a cross sectional view of the microscopic structure having deposited thereon a capping layer in accordance with one embodiment of the present invention.
Figure 3:
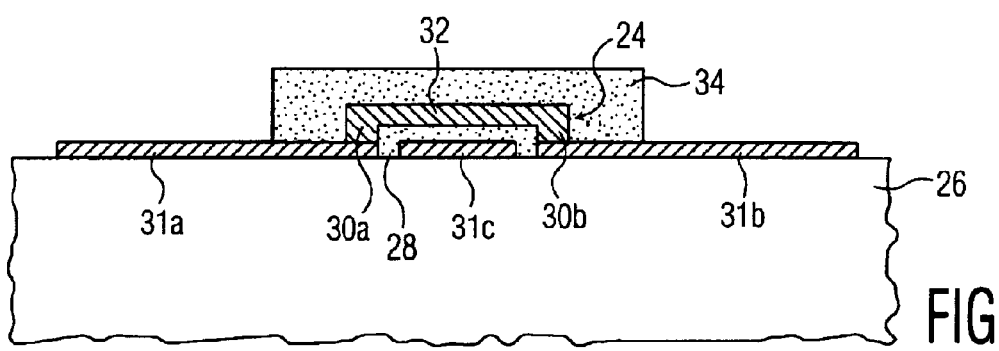
FIG. 3 is a cross sectional view of the microscopic structure with the capping layer, wherein select portions of the capping layer are etched in accordance with one embodiment of the present invention.

Referring to FIGS. 2 and 3, a capping or sacrificial layer 34 is deposited on the microscopic structure 24 and the substrate 26. The capping layer 34 is composed of a suitable material such as, for example, an oxide material such as silicon dioxide, a photoresist material, a polyamide material, and so forth. The thickness of the capping layer 34 can vary depending on the degree of stress control of the microscopic structures 24, the deposition time, the lateral release etch considerations and the volume of the cavity to be formed to accommodate the microscopic structure 24. As shown in FIG. 3, the capping layer 34 can be patterned by removing extraneous portions through lithographical means to modify the size, shape and volume of the resulting cavity.

Figure 4:
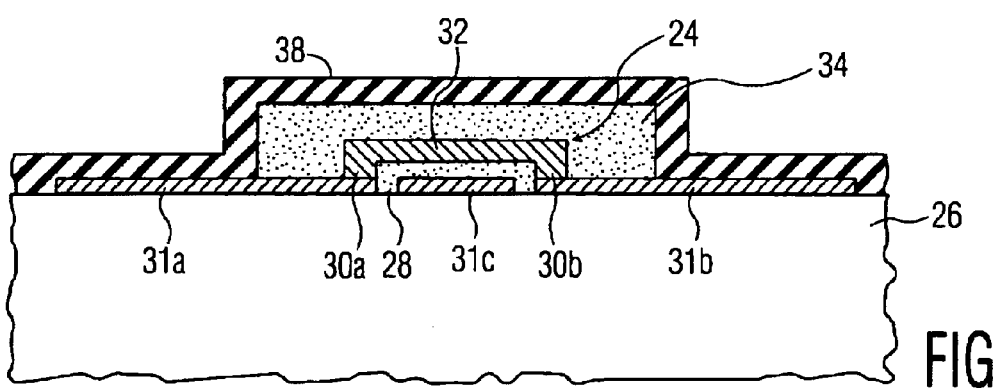
FIG. 4 is a cross sectional view of the microscopic structure with the capping layer having a support layer deposited on and around the capping layer in accordance with one embodiment of the present invention.

Referring to FIG. 4, a support layer 38 is deposited over the exterior of the capping layer 34 using vapor deposition methods. The support layer 38 is typically composed of a suitable material that would resist the etching process used to remove the capping layer 34 ans also exhibit a melting point substantially above that of the metal to be deposited thereon as will be further described below. The higher melting point enhances the ability of the support layer 38 to resist the heat encountered during the melting of the metal. For example, a nitride material can be used as the support layer if the metal is copper. Preferably, the support layer material exhibits a melting point of at least 300° C. above the melting point of the sealing material.

In one embodiment of the present invention, the support layer 34 is deposited to form a layer about two microns thick which can readily support a cavity 100 microns across at one bar difference in pressure between the cavity and ambient to exhibit deflection of less than 0.1 micron. If a larger area is required, anchoring points (not shown) are preferably formed into the substrate to permit support structures to be added to buttress the strength of the support layer 38. Accordingly, the thickness and composition of the support layer can vary depending on the microscopic structure 24 enclosed and the application or specifications at hand.

Figure 5:
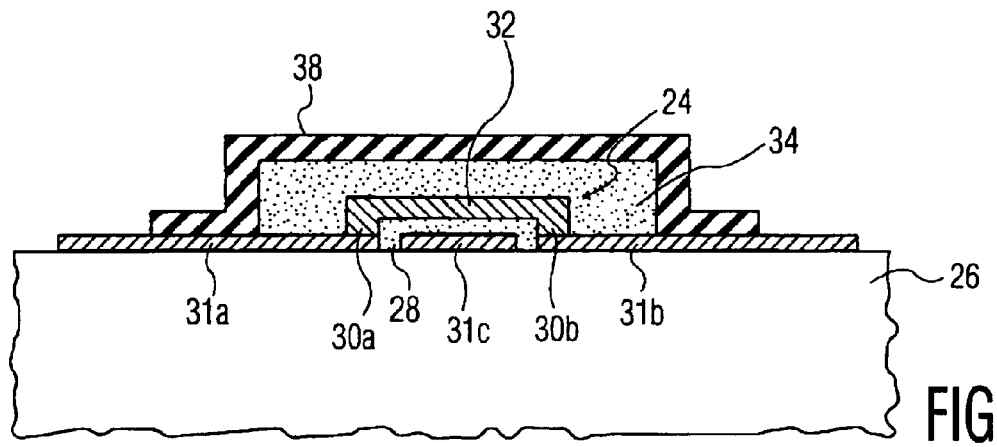
FIG. 5 is a cross sectional view of the microscopic structure with the support layer wherein select portions of the support layer are etched away in accordance with one embodiment of the present invention.

With reference to FIG. 5, the support layer 38 can be patterned through lithography to remove extraneous portions to reduce the area occupied on the substrate.

Figure 6:
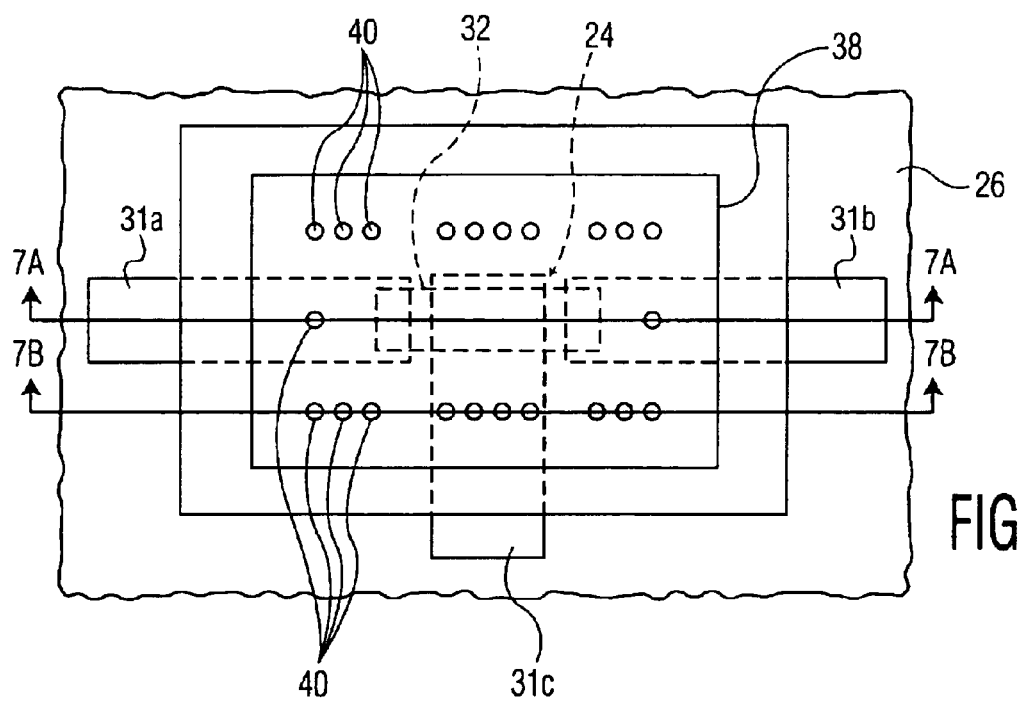
FIG. 6 is a top plan view of the microscopic structure in phantom with the support layer having multiple throughholes or vias penetrating through the support layer in communication with the capping layer in accordance with one embodiment of the present invention.

With reference to FIG. 6, a top plan view of the support layer 38 with the microscopic structure 24 (dotted) is shown. The positioning of the vias or holes 40 in the support layer 38 and the relative positions of the components thereof is shown in FIG. 6. The support layer 38 is further patterned through lithography to form a series of vias or holes 40 extending therethrough to the capping layer 34. Considerations including the number, size, and location of the vias or holes 40 are generally determined by the type and shape of microscopic structure to be released, the form of electrical connections, the need for implementing proper outgassing, the type of sealing material used, the structural features of the support layer 38 and the like. Preferably, the vias or holes 40 include an aspect ratio (via hole depth:via hole diameter) of at least 0.5.

As noted previously, it is preferable to form the vias or holes 40 in the support layer 38 offset from any components including the microscopic structure 24 located within in the cavity 44, in order to substantially minimize the risk of having the sealing material leak through the vias or holes 40 and damaging any of the components during the reflow process.

In one embodiment, it is preferable to form a number of vias or holes 40 that is sufficient to facilitate release of the microscopic structure 24 during removal of the capping layer 38, and to facilitate passage of moisture and undesired gases during the outgassing process. It is further preferable to position the vias or holes 40 vertically in the support layer 38 and offset away from the microscopic structure 24 (as best shown in FIG. 6) to minimize the risk of the sealing material landing onto the microscopic structure 24 during the deposition process as will be further described hereinafter.

Figure 7A:
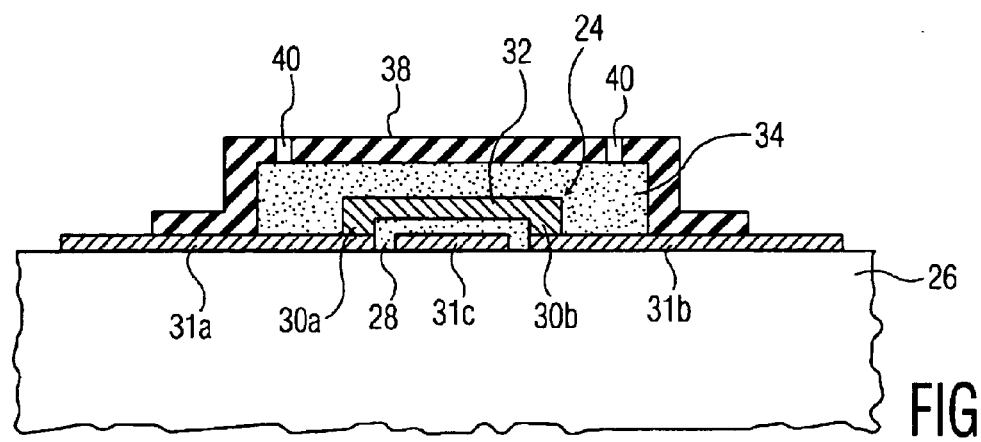
FIG. 7A is a cross-sectional view of the microscopic structure along lines 7A—7A of FIG. 6 in accordance with the present invention.
Figure 7B:
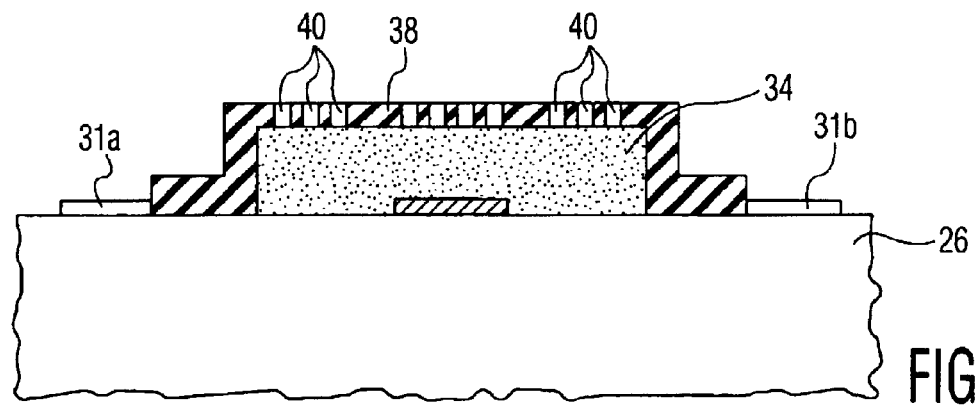
FIG. 7B is a cross sectional view of the microscopic structure along lines 7B—7B in accordance with the present invention.

Referring to FIGS. 7A and 7B, cross sectional views of the structure of FIG. 6 are shown to illustrate the position of the throughholes or vias 40. As noted above, the throughholes 40 extend from the surface of the support layer 38 to the capping layer 34 to ensure passage of a suitable etch chemical and the etched product of the capping layer 34 during the etching process.

Figure 8:
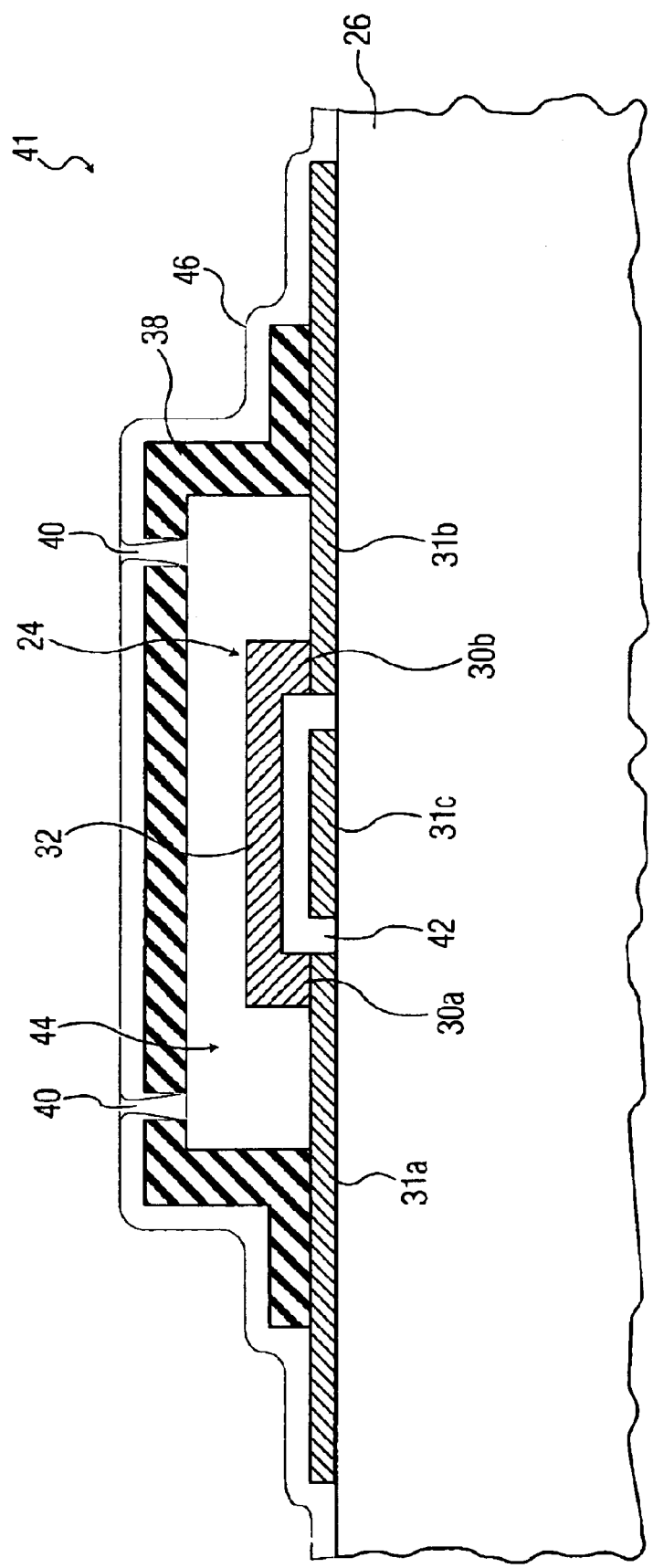
FIG. 8 is a cross sectional view of the microscopic structure of FIG. 7A with the support layer forming a shell, whereby the capping layer has been removed and having deposited thereon a sealing material on the surface of the support layer providing a shell to yield an enclosed microscopic structure in accordance with one embodiment of the present invention.

With reference to FIG. 8, once the vias or holes 40 are formed, the etch process is implemented to remove the capping layer 34 and release the microscopic structure 24, thereby forming an encapsulated microscopic structure 41 having a cavity 44 defined by the support layer 38 and in communication with ambient through the vias or holes 40. The encapsulated microscopic structure 41 is allowed to dry after the etch process is completed. Upon drying, an outgassing process is implemented on the encapsulated microscopic structure 41 to outgas the cavity and all exposed material prior to metal deposition as described below. The outgassing process ensures that the atmosphere contained in the cavity 44 will be maintained in the same state after sealing from ambient. The outgassing process can be implemented by heating the encapsulated microscopic structure in an oven under high vacuum to facilitate the outgassing of the interior surfaces. It is preferable to carry out the outgassing process prior to the deposition of the sealing or metal layer, thus greatly reducing the time for outgassing.

In one embodiment, the encapsulated microscopic structure 41 is heated to a temperature of from about 200° C. to 400° C. depending on the temperature tolerance of the microscopic structure 24. Optionally, initial contact conditioning can also be performed on the encapsulated microscopic structure 41.

With further reference to FIG. 8, once the outgassing process is completed, a sealing material layer 46 is deposited onto the surface of the support layer 38 through suitable deposition methods including sputtering or evaporation. The sealing material layer 46 is typically a meltable material including metal such as, for example, aluminum, gold, or copper. Preferably, the sealing material layer 46 is deposited in an amount sufficient to yield a thickness of at least 50% of diameter of the via or hole 40. It is noted that the outgassing, sealing material deposition and the subsequent laser reflow process can be implemented using known existing technology.

Figure 9:
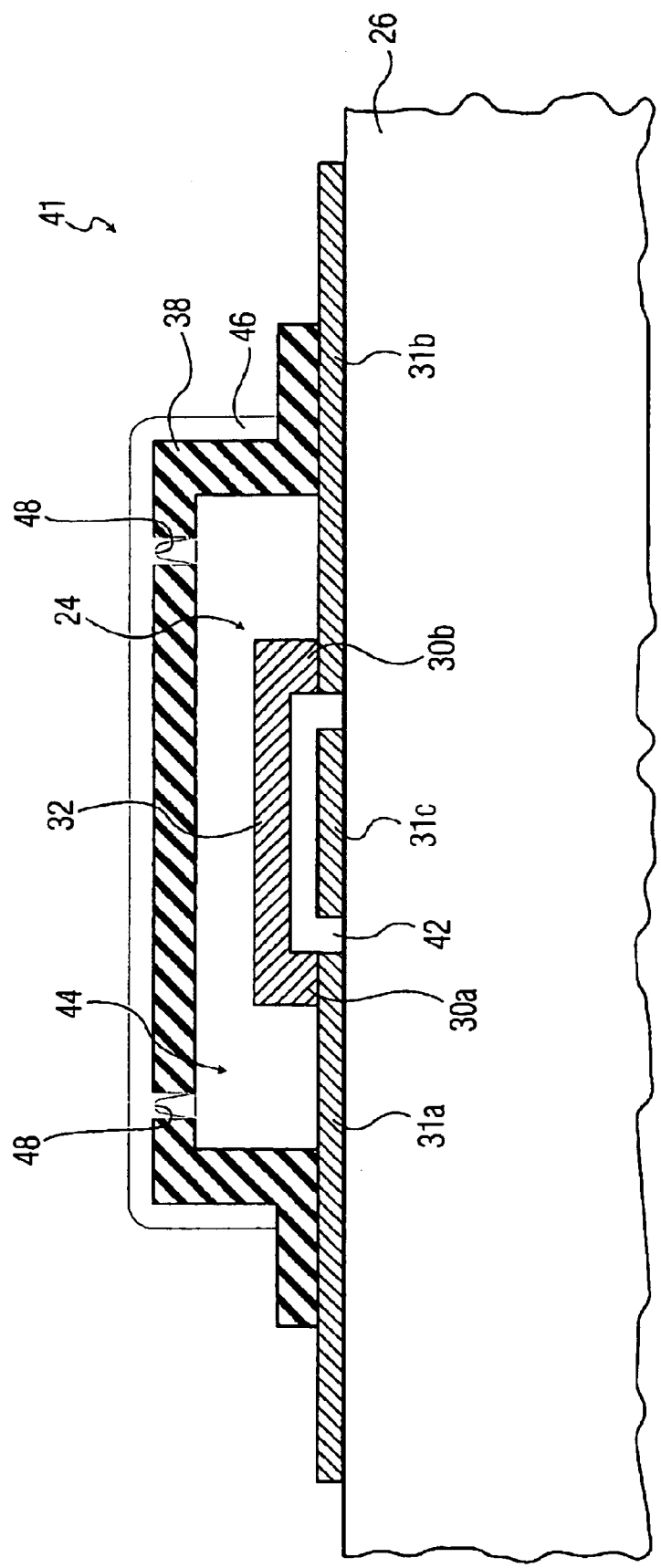
FIG. 9 is a cross sectional view of the enclosed microscopic structure of FIG. 8 with the throughholes or vias closed off from ambient to provide a hermetic pressure seal for the cavity in accordance with one embodiment of the present invention.

Referring to FIG. 9, once the deposition of the sealing material layer 46 is completed. The sealing material layer 46 is then patterned by removing extraneous portions through lithographical means to modify the area of coverage to the support layer 38. A heat source is then used to rapidly melt portions of the sealing material layer 46 and seal the vias or holes 40. The preferred heat source is a laser or coherent light source, and more preferably a short pulse laser. Examples of suitable lasers include an excimer laser, a solid state pumped laser (Q-switched) and the like. The laser is configured to heat at least a portion of the sealing material layer 46 to a temperature significantly exceeding the melting point of the sealing material in a relatively short span of time. As the molten sealing material flows over the vias or holes 40, it rapidly cools and solidifies, thus blocking the passage of the vias or holes 40 and forming a hermetic pressure seal. The heating, melting and re-solidification of the sealing material occur in a short period of time so that little of the molten material flows down into the vias or holes 40. As a result, most of the sealing material accumulates at the upper end of the via or hole 40, thus resulting in a pressure seal that is both physically robust and at least substantially impermeable to the passage of gas.

Figure 10:
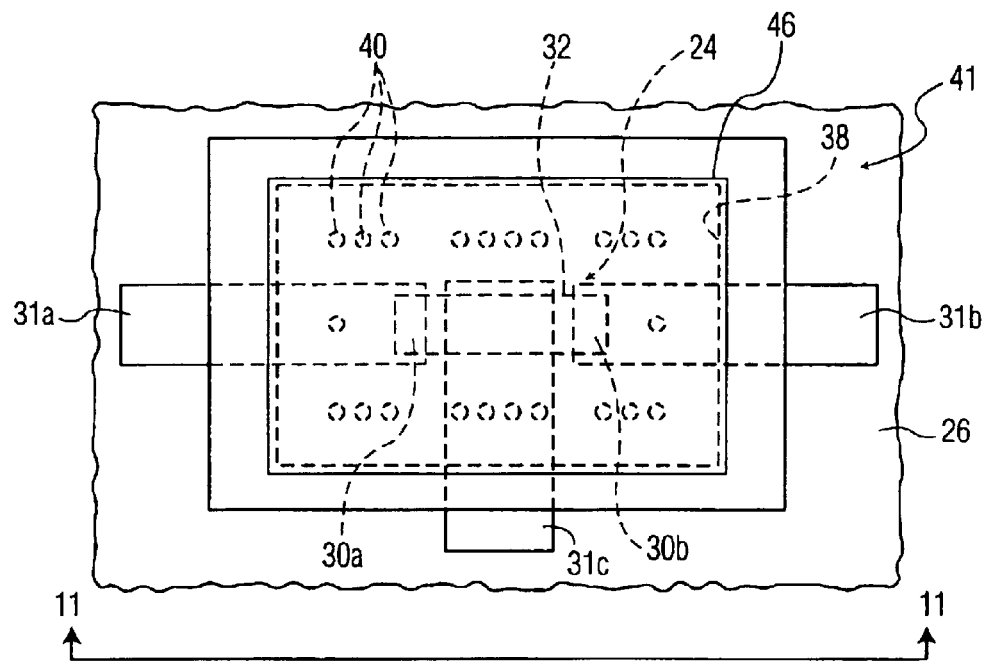
FIG. 10 is a top view of the enclosed microscopic structure of FIG. 9 with the via holes sealed off in accordance with the present invention.
Figure 11:
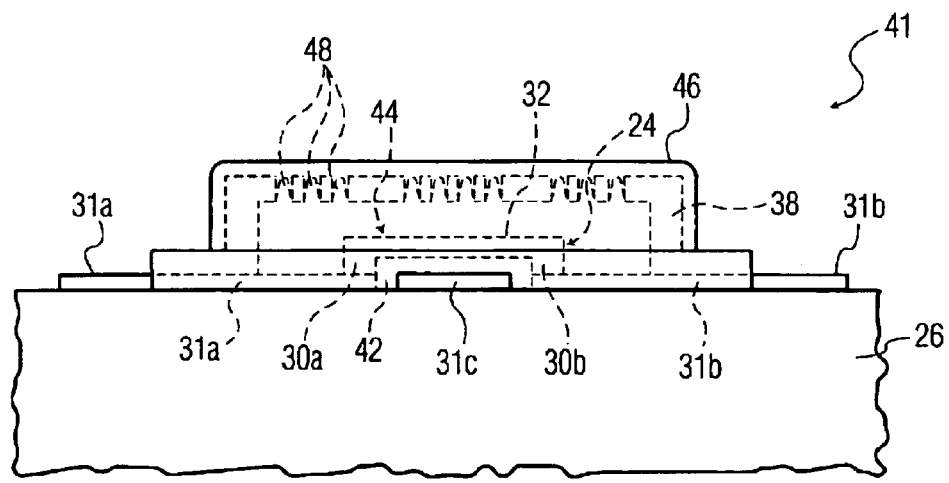
FIG. 11 is an end view of the enclosed microscopic structure along lines 11—11 of FIG. 10 in accordance with the present invention.

With reference to FIG. 10, a top plan view of the encapsulated microscopic structure 41 with the sealed vias 40 is shown. With reference to FIG. 11, an end view of the encapsulated microscopic structure 41 is shown along lines 11—11 of FIG. 10.

Applicants have discovered that by rapidly heating the sealing material in a relatively short span of time a robust hermetic pressure seal is effectively produced. Applicants believe that the rapid absorption of energy by the sealing material generates a shock wave, which breaks up the surface crust, thereby exposing the molten portion of the sealing material. The molten sealing material portion having a relatively high surface tension and low viscosity is dispatched by the shock wave in the form of a capillary wave across the openings of the vias or holes 40. A large portion of energy is rapidly dissipated through radiation upon closure of the vias or holes 40. A further advantage of using a laser reflow process is that, during re-solidification, the molten sealing material uniformly crystallizes from a single seed crystal in the via or hole 40, thereby forming a stronger and more robust hermetic seal with minimal weak spots that may adversely affect the long term integrity of the seal. The heat of the molten sealing material penetrates only a short distance (i.e., less than 0.5 micron) through the support layer 38, thus the wafer and the microscopic structure 24 remains unaffected.

In one embodiment of the present invention, a single laser pulse is applied to induce the reflow of the sealing material and seal the via or hole 40. The laser pulse is first reshaped spatially using a homogenizer. The laser fluence or energy density of the laser is preferably from about 1.5 J/cm$^2$ to 3.5 J/cm$^2$ depending on the reflectivity of the sealing material, the amount of sealing material used, the melting point of the sealing material, and the like. In a preferred embodiment of the present invention, the laser includes a pulse duration in the range of from about 10 nanoseconds to 100 nanoseconds in order to prevent or at least minimize excessive flow of the molten sealing material down the via or hole 40. Applicants have determined that an Excimer laser pulse having an energy content of about 500 mJ and a repetition rate of about 100 Hz can reflow an eight-inch wafer in less than 20 seconds using the reflow process for the present invention.

Figure 12:
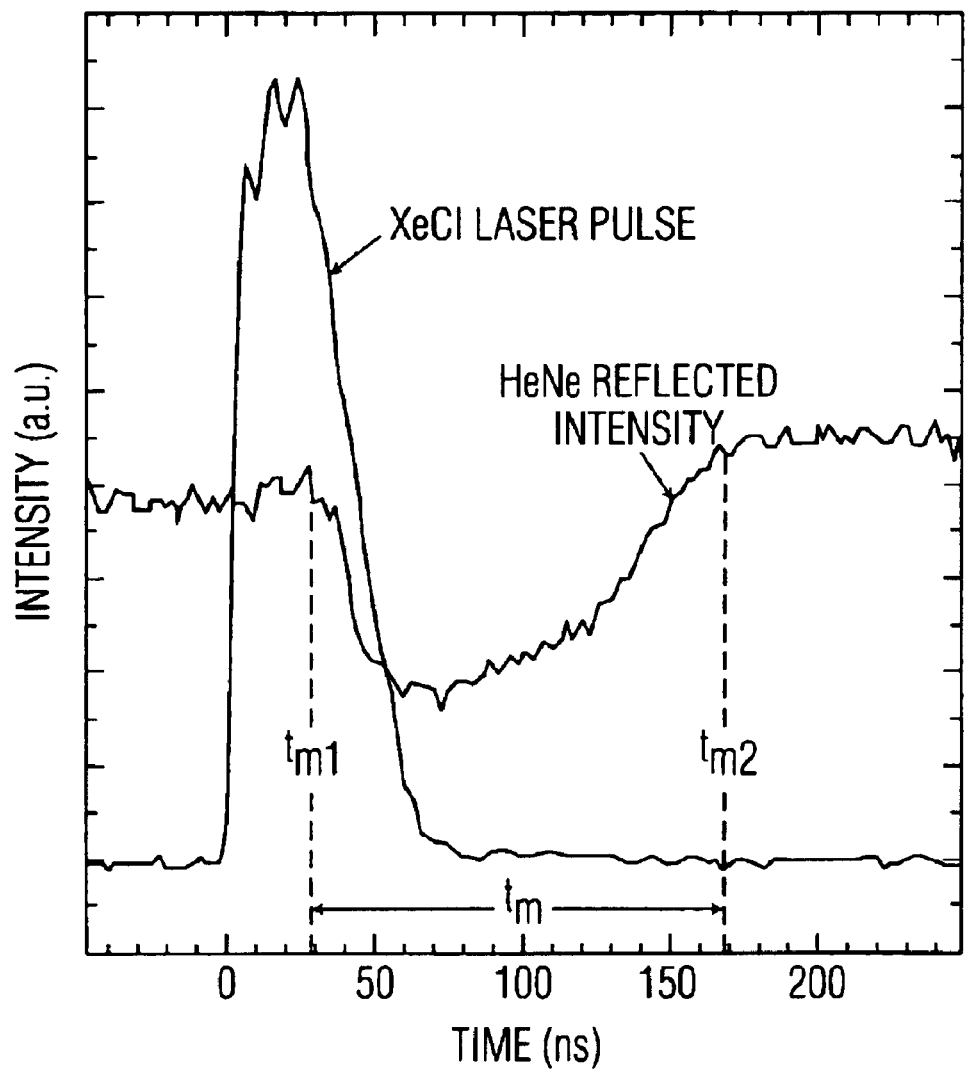
FIG. 12 is a graph demonstrating the relatively brief period of time a sealing material remains melted by a laser pulse during the reflow sealing process in accordance with the present invention.

Referring to FIG. 12, the graph shown demonstrates the short time period during which a sealing material is melted by a short laser pulse having a pulse duration of about 70 nanoseconds. The melting of the sealing material was monitored by measuring the change in surface reflectivity of the sealing material. At t=0, a single laser pulse was applied to the sealing material. The sealing material was heated to a melted state at about 30 nanoseconds, and remained in the melted state for about 140 nanoseconds later, whereafter the sealing material solidified.

Figure 13:
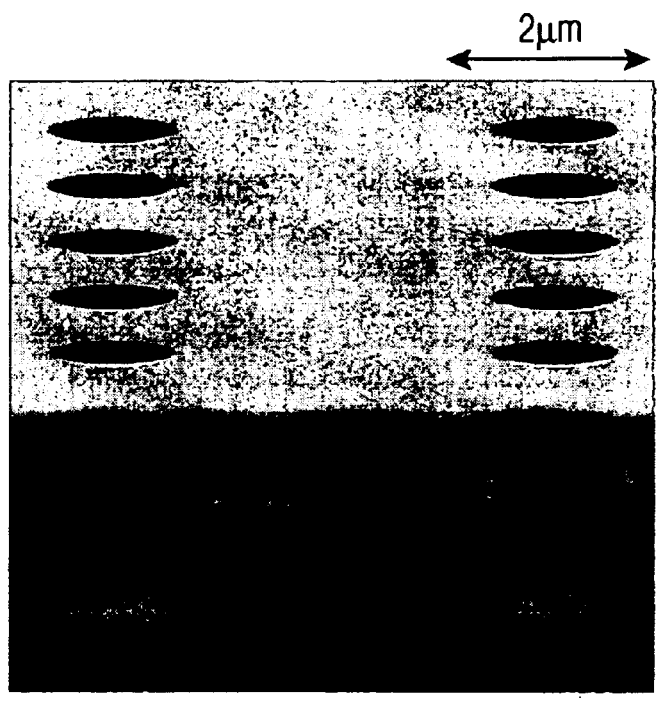
FIG. 13 is a micrograph of a sample support layer having a plurality of closed-ended via holes disposed therein with a layer of copper metal coating the surface thereof.
Figure 14:
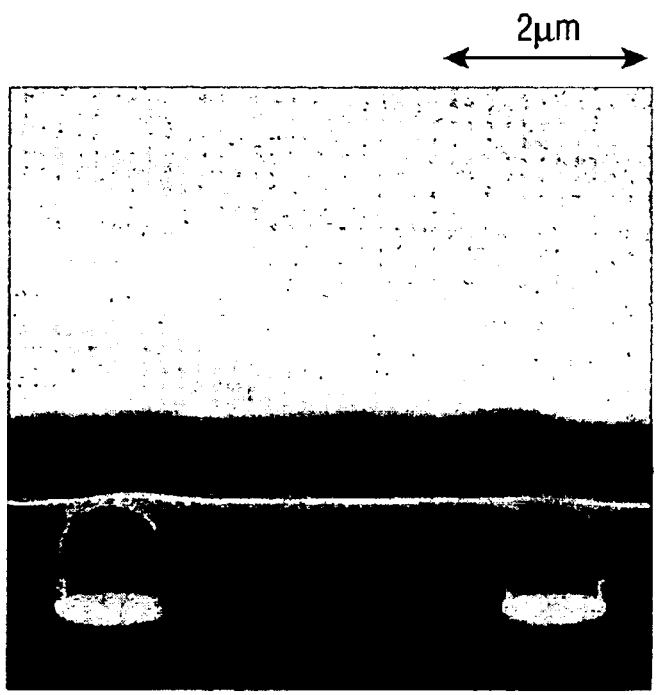
FIG. 14 is a micrograph of the sample support layer of FIG. 13 with the open via holes sealed by the reflow of the copper metal coating after the passing of a laser beam over the surface thereof.

With reference to FIGS. 13 and 14, a substrate having a series of via holes is shown coated with a layer of copper that is sputter deposited along the top surface. As shown in FIG. 13, the highly directional deposition of the copper fails to seal off the via holes with little copper present in the via holes. As shown in FIG. 14, after a single laser pulse (XeCl, 1.7 J/cm$^2$) transiently melts the copper metal, the upper portion of the via holes are completely sealed and closed from ambient.

EXAMPLE

Reflow Sealing of Vias Formed in a Silicon Nitride Support Layer

A thick support layer (1 micron thick) composed of silicon nitride is prepared though sputtering over a microscopic structure. Multiple vias each having a diameter of about 1 micron are etched into the support layer. A copper layer (1 micron thick) is deposited onto the surface of the thick support layer using sputter deposition. An Excimer laser having a wavelength of about 308 nm and a per pulse energy of about 500 mJ focused on a 5 mm by 5 mm spot size is used. The laser is passed through a homogenizer. The laser scans over the copper layer at a rate of about one laser pulse per spot.

Although various embodiments of the present invention have been shown and described, they are not meant to be limiting. Those of skill in the art may recognize certain modifications to those embodiments, which modifications are meant to be covered by the spirit and scope of the appended claims.

What is claimed is:

1. A process for packaging a microscopic structure, said process comprising the steps of:
   assembling a microscopic structure substantially enclosed within a cavity defined by a shell having at least one throughhole extending therethrough in communication with the cavity; and
   depositing a meltable material onto at least an exterior portion of the shell proximate the at least one hole; and
   selectively heating the meltable material for a sufficient time in an area proximate to and surrounding said at least one throughhole or via to a temperature sufficient to generate the molten material, whereby the molten material flows partially into and blocks the span of the last one hole prior to cooling and solidification to yield the hermetic pressure seal.

2. The process for claim 1, wherein assembling step further comprises the steps of:
   forming the microscopic structure on a substrate;
   depositing a capping layer on said microscopic structure;
   depositing a support layer on said capping layer;
   forming at least one hole through the support layer in communication with the capping layer; and
   removing the capping layer through the at least one hole to yield the cavity defined by said support layer providing said shell.

3. The process for claim 2, wherein the capping layer is composed of a material removable through etching selected from the group consisting of an oxide, a photoresist material, and a polyamide material.

4. The process for claim 1, wherein the shell is composed of a dielectric material.

5. The process for claim 4, wherein the shell material is a nitride material.

6. The process for claim 1, wherein the meltable material is a metal.

7. The process for claim 6, wherein the metal is selected from the group consisting of aluminum, gold, copper and combinations thereof.

8. The process for claim 1, wherein the microscopic structure forms at least part of a MEMS device.

9. The process for claim 1, further comprising the step of outgassing the microscopic structure and support layer prior to the applying step.

10. The process for claim 1, wherein the heating step further comprises the step of applying a laser to the meltable material for a sufficient time to generate the molten material.

11. The process for claim 10, wherein the energy density of the laser ranges from about 1.5 J/cm$^2$ to 3.5 J/cm$^2$.

12. The process for claim 10, wherein the laser is applied as a single pulse.

13. The process for claim 12, wherein the single pulse has a pulse duration of from about 10 nanoseconds to 100 nanoseconds.

14. The process for claim 1, wherein the aspect ratio of the at least one hole is at least 0.5.

15. The process for claim 1, wherein the meltable material is deposited in sufficient amounts to achieve a thickness of at least 50% of the diameter of the at least one hole.

16. The process for claim 1, wherein the shell has a higher melting point than the melting point of the molten material.

17. A process for packaging a microscopic structure, said process comprising the steps of:

forming shell around a microscopic structure, said shell having a cavity in which said microscopic structure resides;

forming at least one throughhole or via in said shell;

depositing a meltable material onto at least an exterior portion of the shell proximate the at least one throughhole; and selectively heating the meltable material proximate the at least one throughhole to a temperature sufficient to locally melt the material for a sufficient time to cause the molten material to at least partially flow into and block the span of the at least one throughhole prior to the material cooling and solidifying to yield a hermetic pressure seal.

18. A process for packaging a MEMS device, said process comprising the steps of:

forming a MEMS device on a substrate;

depositing a capping layer of sacrificial material on said MEMS device;

depositing a support layer on said capping layer;

forming a plurality of throughholes or vias through the support layer in communication with the capping layer;

removing the capping layer through at least one of said plurality of throughholes to yield a microcavity defined by said support layer to provide a shell around said MEMS device;

depositing a metallic material on the exterior of the support layer in a manner leaving said metallic material surrounding but not covering said plurality of throughholes; and increasing the temperature of the metallic material proximate selective ones of said plurality of vias, respectively, for a sufficient time to cause said metallic material to melt and partially flow into, solidify, and block adjacent ones of said plurality of vias.

19. A process for hermetically packaging a microscopic structure, the process comprising the steps of:

depositing a capping layer of sacrificial material patterned by lithography over the microscopic structure supported on a substrate;

depositing a support layer of a dielectric material patterned by lithography over the capping layer, providing a plurality of vias through the support layer by lithography;

removing the capping layer via wet etching to leave the support layer intact in the form of a shell having a cavity occupied by the microscopic structure;

depositing a metal layer over the support layer that is thick enough to provide a barrier against gas permeation, but thin enough to leave the vias open; and selectively applying under high vacuum a laser beam to the metal proximate each via for a sufficient period of time to melt the metal for sealing the via.

* * * * *